(12) United States Patent
Gregory et al.

(10) Patent No.: US 8,146,047 B2
(45) Date of Patent: *Mar. 27, 2012

(54) AUTOMATION METHOD AND SYSTEM FOR ASSESSING TIMING BASED ON GAUSSIAN SLACK

(75) Inventors: Brent Gregory, Cupertino, CA (US); William C. Naylor, Jr., San Jose, CA (US); Bogdan Craciun, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 529 days.

This patent is subject to a terminal disclaimer.

(21) Appl. No.: 12/341,677

(22) Filed: Dec. 22, 2008

(65) Prior Publication Data

US 2009/0106722 A1 Apr. 23, 2009

Related U.S. Application Data

(63) Continuation of application No. 11/183,414, filed on Jul. 18, 2005, now Pat. No. 7,484,194.

(51) Int. Cl.
*G06F 17/50* (2006.01)
*G06F 11/22* (2006.01)

(52) U.S. Cl. ........ 716/136; 716/108; 716/113; 716/134; 703/13; 703/14

(58) Field of Classification Search .......... 716/108, 716/113, 134, 136; 703/13–14
See application file for complete search history.

(56) References Cited

U.S. PATENT DOCUMENTS

| | | | |
|---|---|---|---|
| 5,365,463 A * | 11/1994 | Donath et al. ................. | 703/19 |
| 5,544,071 A | 8/1996 | Keren et al. | |
| 5,642,391 A | 6/1997 | Ewell et al. | |
| 6,684,375 B2 | 1/2004 | Tsukiyama et al. | |
| 6,766,504 B1 | 7/2004 | Rahut et al. | |
| 6,851,098 B2 | 2/2005 | Schultz | |
| 6,868,533 B2 * | 3/2005 | Alpert et al. .................. | 716/113 |
| 7,086,023 B2 | 8/2006 | Visweswariah | |
| 7,111,260 B2 | 9/2006 | Visweswariah | |
| 7,761,826 B1 * | 7/2010 | Thanvantri et al. ........... | 716/108 |
| 7,870,525 B2 * | 1/2011 | Foreman et al. .............. | 716/113 |
| 2004/0002844 A1 | 1/2004 | Jess et al. | |
| 2004/0243954 A1 | 12/2004 | Devgan et al. | |
| 2005/0065765 A1 | 3/2005 | Visweswariah | |
| 2006/0059446 A1 | 3/2006 | Chen et al. | |
| 2006/0101361 A1 | 5/2006 | Foreman et al. | |

OTHER PUBLICATIONS

Desai, Madhav et al., "A Systematic Technique for Verifying Critical Path Delays in a 300 MHz Alpha CPU Design Using Circuit Simuation," Proc. of the 33rd Annual Conf. on Design Automation, 1996, 6 pages, Las Vegas, NV.

Gattiker et al., "Timing Yield Estimation from Static Timing Analysis," Proc. IEEE Int'l. Symposium on Quality Electronic Design (ISQED) 2001, pp. 437-442.

(Continued)

*Primary Examiner* — Nghia Doan
(74) *Attorney, Agent, or Firm* — Haynes Beffel & Woldfeld LLP

(57) ABSTRACT

An automated design process using a computer system includes identifying a set of timing endpoints in a circuit defined by a machine-readable file. Values of slack in the estimated arrival times for the timing endpoints are assigned. Probability distribution functions, such as Gaussian distributions, are assigned for the respective values of slack, and are combined. The combination of probability distribution functions represents a measure of circuit performance. The measure is computed for alternative implementations of the circuit, and used to identify an alternative more likely to meet timing constraints.

27 Claims, 9 Drawing Sheets

OTHER PUBLICATIONS

Georgia State University, Department of Astronomy and Physics, "Gaussian Distribution Function," Mar. 16, 2005, 2 pages, http://hyperphysics.phy-astr.gsu.edu/hbase/math/gaufcn.html.

Hitchcock, Robert B., Sr., "Timing Verification and the Timing Analysis Program," 19th Design Automation Conference, 1982, IEEE, pp. 594-604.

Jess et al., "Statistical Timing for Parametric Yield Prediction of Digital Integrated Circuits," IEEE Trans. on Computer-Aided Design of IC and Systems 25 (11) Nov. 2006, 2376-2392.

Liou, Jing-Jia, et al., "Performance Sensitivity Analysis Using Statistical Methods and Its Applications to Delay Testing," 2000 IEEE, pp. 587-592.

Liou, Jing-Kia, et al., "Fast statistical timing analysis by probabilistic event propagation" Proc. Design Automation Conference, 2001.

Scheffer, "Explicit Computation of Performance as a function of Process Variation," Proc. Design Automation Conf., Jun. 2001, Las Vegan, Nev. pp. 661-666.

* cited by examiner

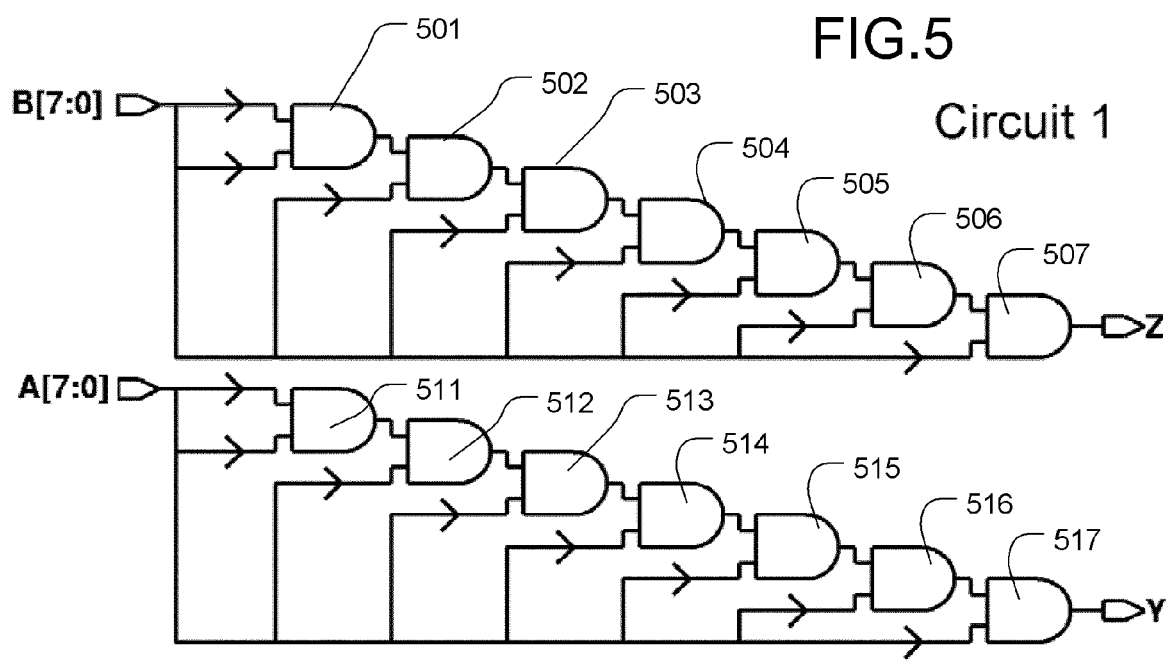
FIG.5 Circuit 1
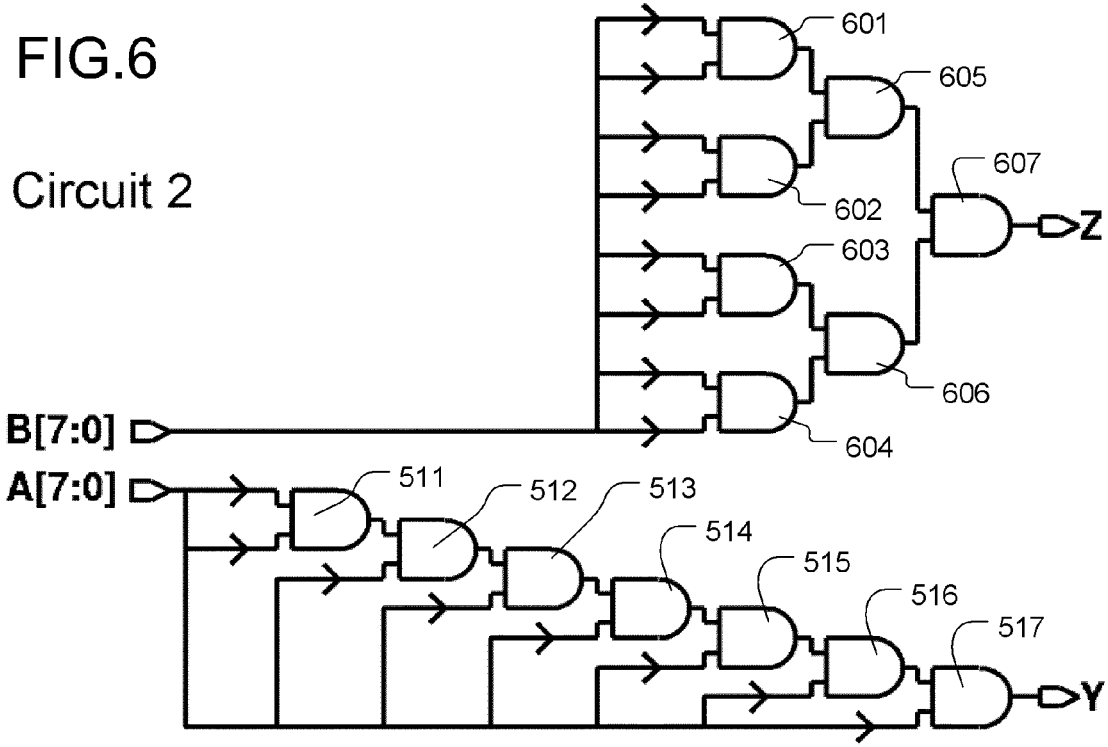
FIG.6 Circuit 2

AUTOMATION METHOD AND SYSTEM FOR ASSESSING TIMING BASED ON GAUSSIAN SLACK

RELATED APPLICATIONS

This application is a continuation of U.S. application Ser. No. 11/183,414, filed on 18 Jul. 2005, and such application is incorporated by reference as if fully set forth herein.

COPYRIGHT AUTHORIZATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever

BACKGROUND OF THE INVENTION

1. Field of the Invention

The present invention relates to electronic design automation in the integrated circuit industry.

2. Description of Related Art

Electronic design automation EDA is applied in the semiconductor industry for virtually all device design projects. After an idea for the product is developed, EDA tools are utilized to define a specific implementation. The implementation defined using EDA tools is used to create mask data used for production of masks for lithographic use in the production of the finished chips, in a process referred to as tape-out. The masks are then created and used with fabrication equipment to manufacture integrated circuit wafers. The wafers are diced, packaged and assembled to provide integrated circuit chips for distribution.

An exemplary procedure for design using EDA tools begins with an overall system design using architecture defining tools that describe the functionality of the product to be implemented using the integrated circuit. Next, logic design tools are applied to create a high level description based on description languages such as Verilog or VHDL, and functional verification tools are applied in an iterative process to assure that the high-level description accomplishes the design goals. Next, synthesis and design-for-test tools are used to translate the high-level description to a netlist, optimize the netlist for target technology, and design and implement tests that permit checking of the finished chip against the netlist.

A typical design flow might next include a design planning stage, in which an overall floor plan for the chip is constructed and analyzed to ensure that timing parameters for the netlist can be achieved at a high level. Next, the netlist may be rigorously checked for compliance with timing constraints and with the functional definitions defined at the high level using VHDL or Verilog. After an iterative process to settle on a netlist and map the netlist to a cell library for the final design, a physical implementation tool is used for placement and routing. A tool performing placement positions circuit elements on the layout, and a tool performing routing defines interconnects for the circuit elements.

The components defined after placement and routing are usually then analyzed at the transistor level using an extraction tool, and verified to ensure that the circuit function is achieved and timing constraints are met. The placement and routing process can be revisited as needed in an iterative fashion. Next, the design is subjected to physical verification procedures, such as design rule checking DRC, layout rule checking LRC and layout versus schematic LVS checking, that analyze manufacturability, electrical performance, lithographic parameters and circuit correctness.

After closure on an acceptable design by iteration through design and verify procedures, like those described above, the resulting design can be subjected to resolution enhancement techniques that provide geometric manipulations of the layout to improve manufacturability. Finally, the mask data is prepared and taped out for use in producing finished products.

In some of the analysis stages, the EDA tools perform timing checks to ensure that the circuits being laid out satisfy the timing constraints of the product. Exemplary tools used for performing timing checks are often referred to as timing verifiers or timing analyzers, and include such commercially available products as DesignTime and PrimeTime, distributed by Synopsys, Inc. of Mountain View Calif. Because of the complexity of modern integrated circuit design, a single chip may have hundreds of thousands of circuit paths that must meet specific timing constraints. Also, changes made during the process to one part of a design can have complicated and difficult to predict implications for other parts of the design.

For example, a timing constraint for a circuit path, that starts with the output of a clocked register, and passes through combinational logic to an input of another clocked register, is that delay through the combinational path does not exceed the time interval between the clock at the first register and the clock at the last register. This time interval is often the period of the clock used on the chip on critical timing paths, and limits the maximum clock frequency that can be used.

The difference between the delay through a timing path and the specified timing constraint is often referred to as slack. Negative slack means that the constraint is not met because the delay through the path, as measured at a timing endpoint for the path, exceeds the time allowed. Positive slack means that the constraint is met or exceeded, because the delay through the path is less than the time allowed.

One function performed by timing verifiers comprises computing a circuit's maximum clock frequency by measuring the critical path timings through the logic. Because circuit delays are never known with complete precision, designers often look at near-critical paths to get an idea how circuit timing might change as the internal delays change in subsequent steps in the implementation tool flow. The total negative slack (TNS) of all timing endpoints is commonly used to assess the near-critical endpoints for a sign of troubles ahead. The TNS is computed by simply adding together the negative slack on all the timing endpoints having negative slack, while ignoring endpoints with positive slack. A high TNS is a measure of poor timing performance of a design. Therefore, as one iterates through the design process, the designer can use a timing verifier tool to monitor changes in TNS to indicate whether the changes being proposed to correct specific paths result in an increase or decrease in TNS.

TNS however gives equal credit for improving timing on any endpoint that has a negative slack. Therefore, an improvement in slack on a non-critical timing endpoint yields the same change in TNS as an improvement on a critical timing endpoint. Therefore, it may not provide valuable data, and can be misleading, for some design changes.

Another measure utilized is known as the worst negative slack WNS, which is generated by timing verifiers by evaluating the circuit to find paths that have the worst negative slack in a particular netlist under test. The WNS indicates the maximum clock speed at which the design can reliably operate. However, changes in the WNS are incomplete indicators of overall improvement in a circuit design.

It is desirable to provide a tool that generates an indicator of circuit timing performance which measures improvements in overall timing performance as a replacement or supplement to the TNS and similar measurements.

SUMMARY OF THE INVENTION

A computer-implemented method for automated design of a circuit specified by a machine-readable file like a netlist and having a specified timing constraint, such as clock speed, is described. The method is based on producing a combination of probability distribution functions for values of slack around estimated slack values for timing endpoints in the circuit. In general, the combination provides a measure of circuit performance that might be represented by varying the slack at each timing endpoint in the circuit, according to probability distribution functions at such timing endpoints.

An implementation of the method applies a Gaussian or approximately Gaussian distribution, where for a given timing endpoint the mean of the distribution is equal to or a function of the value for slack at the timing endpoint, and the standard deviation of the distribution is a function of the path length of the circuit driving the timing endpoint. The combination of the resulting distributions is weighted in favor of values of slack of timing endpoints closest to the slack value for the endpoint having the most negative slack, and which are therefore more critical timing endpoints for clock speed of the circuit. Both endpoints having negative and positive slack values can be included in the computation.

An automated design process includes identifying using a computer system a set of timing endpoints for corresponding circuit paths in a circuit defined by a machine-readable file. Values of slack in the estimated arrival times for the timing endpoints are assigned using the computer system. The values of slack are processed to produce a combination of probability distribution functions around the respective values of slack, where the combination represents a measure of circuit performance. The respective values of slack can be produced in embodiments of the technology by storing definitions of components usable in implementation of the circuit in a machine-readable storage medium, and using a timing model and the definitions of components to generate the values for slack. Probability distribution functions are assigned for the respective values of slack, and combined such as by multiplication of corresponding cumulative distribution functions.

An optimization routine is also provided in which the computer implemented method includes selecting an alternative set of components for one or more of said corresponding circuit paths to define an alternative circuit implementation, and computing said combination of distribution functions for the alternative circuit implementation. The machine-readable file that defines the circuit is then updated in response to a comparison of the combination of distribution functions, or a parameter used to represent the combination, produced for the original circuit implementation, and the combination of distribution functions, or a parameter used to represent the combination, produced for the alternative circuit implementation.

Embodiments of the technology described include an article of manufacture comprising a machine-readable data storage medium storing a computer program for analysis of the circuit as described above. Also, the technology described is embodied by an electronic design automation system that includes a data processor, and data processing resources comprising logic used to execute the method described above.

A measure is provided that is useful to assess the likely impact of modifications of circuits, in terms of the likely effect of the modifications on near-critical timing endpoints, clock speed and other timing constraints.

Other aspects and advantages of the present invention can be seen on review of the drawings, the detailed description and the claims, which follow.

BRIEF DESCRIPTION OF THE DRAWINGS

FIG. 5 illustrates a first implementation of a circuit having two timing endpoints, Z and Y.

FIG. 6 illustrates a second implementation of the circuit shown in FIG. 5, having two timing endpoints, Z and Y.

DETAILED DESCRIPTION

A detailed description of embodiments of the present invention is provided with reference to the FIGS. 1-13.

Figure 1:
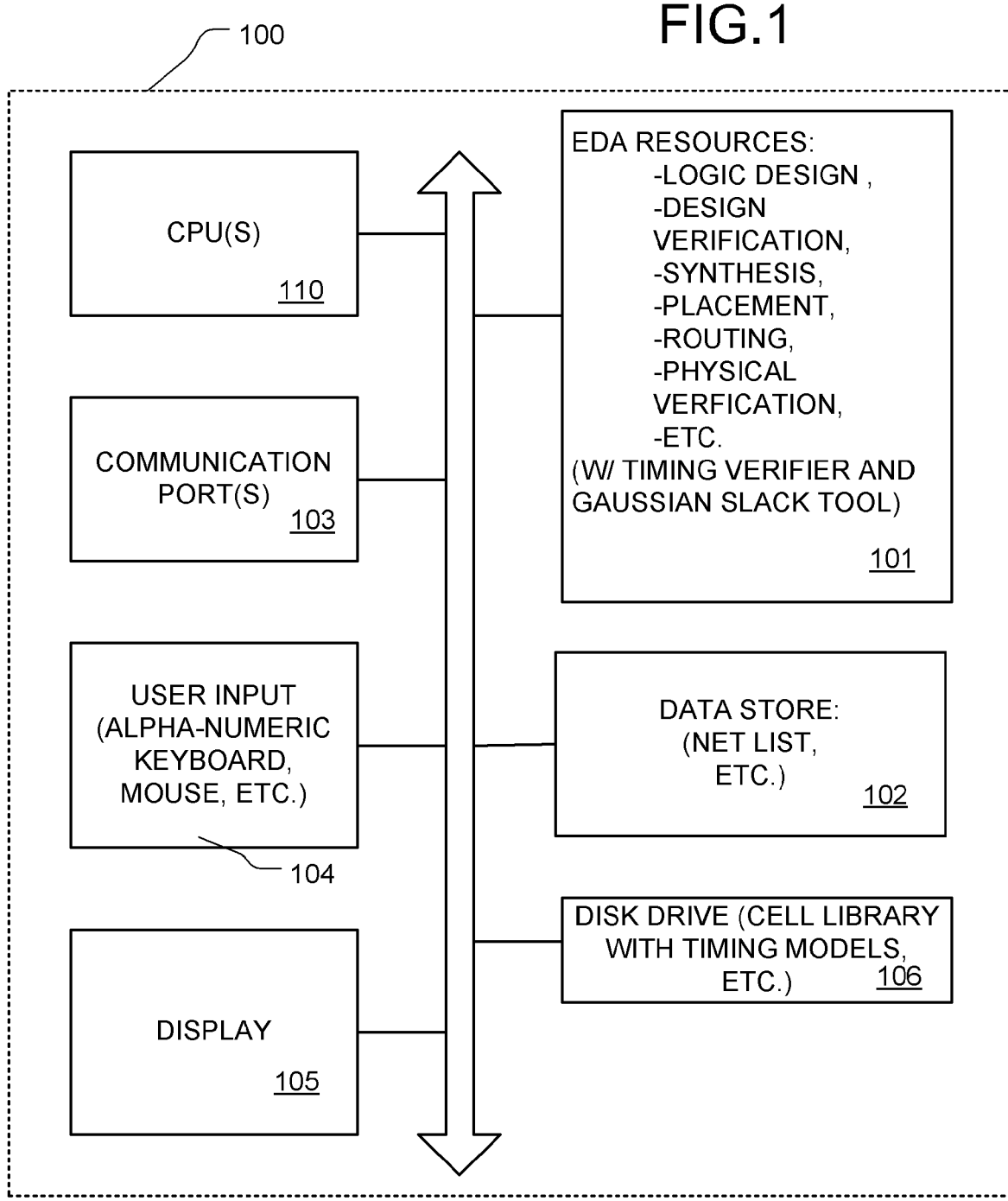
FIG. 1 illustrates an electronic design automation system implementing a Gaussian slack tool.

FIG. 1 is a simplified block diagram of a data processing system 100 arranged as an electronic design automation system implementing the Gaussian slack technology described herein. The system 100 includes one or more central processing units 110, which are arranged to execute computer programs stored in program memory 101, access a data store 102, access large-scale memory such as a disk drive 106, and to control communication ports 103, user input devices 104, and a display 105. Electronic design automation systems as represented by FIG. 1 include a single workstation, and networks of computers utilized by designers of integrated circuits.

The electronic design automation uses data processing resources including logic implemented as computer programs stored in memory 101 for an exemplary system. In alternatives, the logic can be implemented using computer programs in local or distributed machines, and can be implemented in part using dedicated hardware or other data processing resources. The logic in a representative electronic design automation system includes logic design tools, design verification tools, synthesis tools, placement tools, routing tools, physical verification tools and so on. The resources include a timing verifier, which implements a Gaussian slack measurement tool as described herein.

The data store 102 is typically used for storing machine-readable definitions of circuits, such as high-level description language descriptions, netlists, mask definitions and so on. Large-scale memory is used to store cell libraries which include definitions of components used for implementations of the circuits. Components in the cell libraries are associated with timing models, such as the non-linear delay model, used to compute timing delay along the circuit paths implemented using the particular components.

An implementation of a Gaussian slack tool computes slack for a set of timing endpoints in a circuit or a module of the circuit, by taking the output of a conventional timing verifier such as estimated arrival time computed using a non-linear delay model, or the like. The estimated arrival time is converted to a slack value relative to a specified or target timing constraint. Probability distributions for each of the timing endpoints in the selected set are determined. Next, the combined slack probability distribution for the whole set of timing endpoints is determined by combining the probability distributions for each of the timing endpoints. A Gaussian slack parameter can be computed to represent the combined distribution by, for example, taking the mean or the median of the combined probability distribution.

The set of timing endpoints utilized for computation of Gaussian slack can include all timing endpoints in a selected circuit block, or a subset of the timing endpoints selected by the designer. Timing endpoints can be selected by filtering the complete set of timing endpoints according to corresponding path lengths or the like to select a set of timing endpoints considered critical for the particular analysis.

The probability distributions which are determined for each of the timing endpoints are defined in one implementation as the Gaussian distribution having a mean equal to a function of the estimated slack at the timing endpoint, and having a standard deviation equal to a function of the path length of the circuit path driving the corresponding timing endpoint. For example, in one implementation, the mean of the Gaussian distribution determined for a particular timing endpoint is equal to the estimated slack at the timing endpoint, and the standard deviation of the Gaussian distribution for the particular timing endpoint is equal to 1/10 of the path length.

In the embodiment described, the probability distribution function assigned to the timing endpoints is a Gaussian distribution, which is readily computed. Also, an approximately Gaussian distribution implemented by a discrete number of slack sample levels, for example, can be utilized. In addition, for a particular implementation a designer may define other distributions that reflect a probability distribution function for a slack at the timing endpoints in the circuit.

The new measure, referred to herein as Gaussian slack, provides a better way to assess the likely impact of near-critical timing endpoints than prior art measures like TNS. Gaussian slack indicates the impact of near-critical endpoints in terms of their likely effect on a specified timing constraint like clock frequency. Unlike TNS, changes in Gaussian slack can be reported as percentage changes in clock frequency. For example, clock frequency can be computed by taking the inverse of the required path length minus the slack on the determinate paths. A percentage improvement in clock frequency therefore can be computed by taking the change in slack between an original and a new design, and dividing the change by the path length in the new design.

Gaussian slack is more immune to poorly formed timing constraints than TNS. A key advantage of this method is that it is easy to compute using exiting timing verifier technology. It can be computed incrementally inside an optimization engine, so it can then be applied to optimize circuit designs for Gaussian slack.

Figure 2:
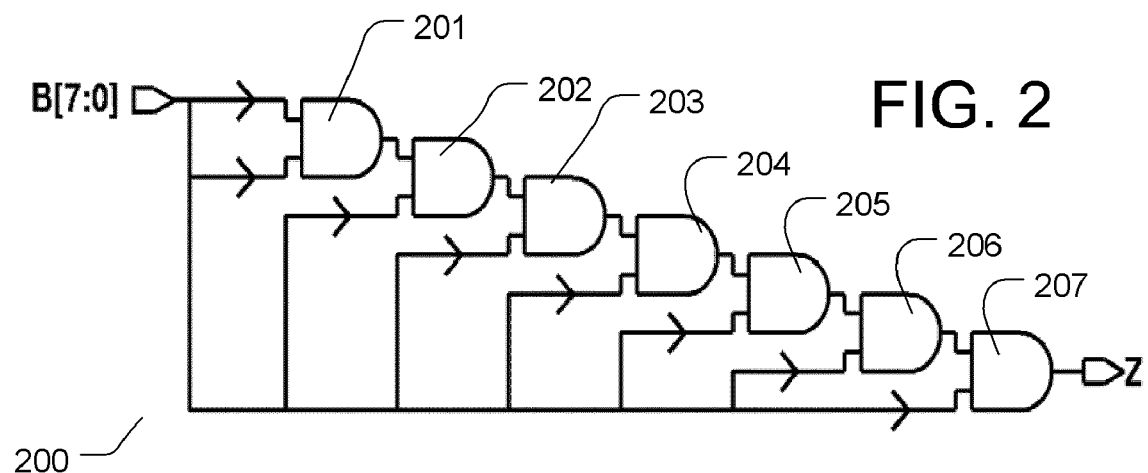
FIG. 2 illustrates a circuit path with a timing endpoint.

FIG. 2 illustrates a circuit path from an input B[0:7] to a timing endpoint Z, which includes a set of circuit components 201, 202, 203, 204, 205, 206, 207. The components 201-207 in the circuit 200 comprise AND-gates, which can be implemented from corresponding components having definitions in a cell library. The definitions of the components in the cell library provide parameters needed for computing a timing delay through each of the components. A timing verifier can be used to compute the delay along the entire circuit path from the input to the timing endpoint. Such delay is referred to as the path length. The inputs are typically set at the node on the output of a clocked register, and the timing endpoint Z typically corresponds with the node at the input of another clocked register. Thus, the speed of the circuit is determined by the path length between the clocked nodes as computed using a timing analyzer.

However, the actual speed is likely to lie in a range of around the estimated speed. For example, before placement in the design flow, a timing analyzer may report that the circuit 200 in FIG. 2 has a 0.00 nanoseconds (ns) of slack. However, there are many different likely placements of the cells in the circuit, and each one will result in a different slack. For example, Table 1 shows possible slack values for a large number of different placements of the circuit.

TABLE 1

| 0.72 | 0.41 | 0.99 | −0.44 | 0.11 | −0.63 | −0.02 |
| 1.38 | 0.97 | 1.64 | −0.08 | 0.07 | −0.87 | −0.53 |
| −0.81 | 2.04 | −1.17 | −0.57 | −1.57 | −0.92 | 1.12 |
| 0.57 | −1.17 | −1.30 | −0.75 | 0.46 | −1.71 | 0.50 |
| −1.00 | 0.26 | −1.83 | 1.44 | 1.65 | −1.50 | 1.16 |
| −0.08 | −1.14 | 1.83 | 1.27 | −0.01 | 1.28 | −0.10 |
| 1.35 | 2.73 | 1.50 | −0.43 | −0.29 | 0.94 | −0.03 |
| 0.41 | −0.48 | 0.73 | 0.96 | −0.34 | −0.13 | 0.60 |

Figure 3:
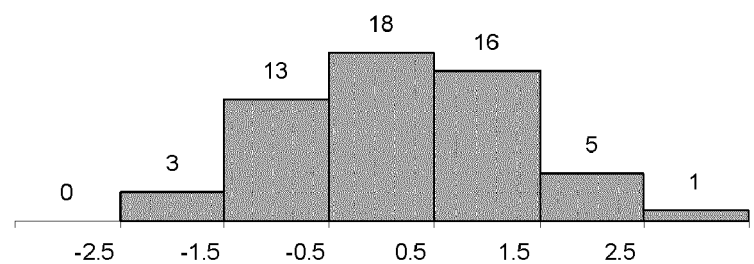
FIG. 3 illustrates a probability distribution function for slack in a circuit like that shown in FIG. 2.
Figure 4:
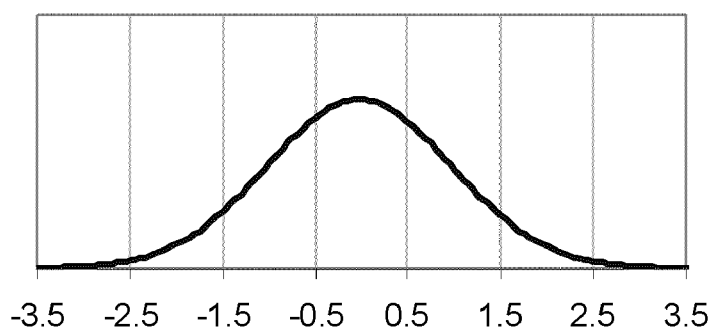
FIG. 4 illustrates a Gaussian probability distribution function for slack in a circuit like that shown in FIG. 2.

FIG. 3 is a histogram of the slack values from the Table 1, with each vertical bar representing a number of samples within a 1 ns wide range. As can be seen, the histogram shows an approximately Gaussian distribution. If more placements were generated for the circuit shown in FIG. 2, and more precise slack steps in value were chosen for plotting, the histogram of probable slack values can be estimated to have a probability distribution such as illustrated in FIG. 4. The distribution illustrated in FIG. 4 is a normal curve, having a classical bell-shape, and representing a Gaussian probability distribution. The curve has a standard deviation, often referred to using the symbol $\sigma$, defined as the square root of the average of the squares of the deviations from the mean. Because of the symmetrical nature of the normal curve, the median and the mean are the same, and lie at the peak of the curve.

To measure the Gaussian slack of a circuit, it is assumed that each timing endpoint can be represented by a distribution like that of FIG. 4. All the distributions of a set of endpoints in the circuit are then combined into a global distribution for the circuit, from which the Gaussian slack parameter is determined. The Gaussian slack parameter can be used as an indicator in a process of optimizing a particular circuit design. For example, FIG. 5 and FIG. 6 illustrate alternative implementations of a circuit having timing endpoints Z and Y, driven by inputs B[0:7] and A[0:7] through respective circuit paths.

Figure 7A:
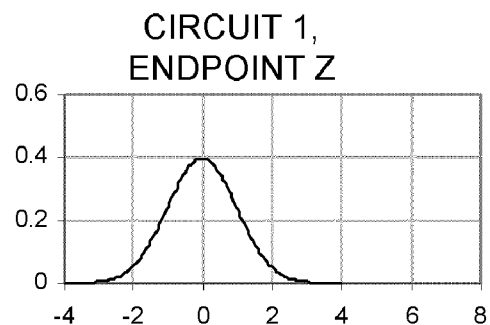
FIGS. 7A-7C illustrate Gaussian slack distributions for endpoints Z and Y, and a combination of the distributions, respectively, for the first implementation of the circuit as shown in FIG. 5.
Figure 8A:
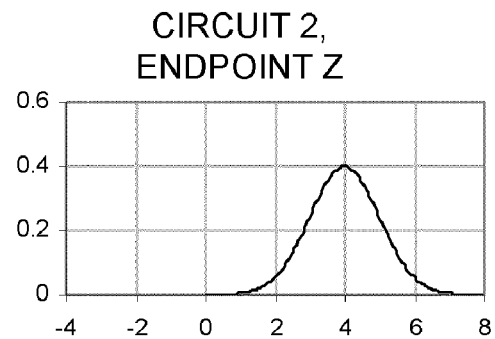
FIGS. 8A-8C illustrate Gaussian slack distributions for endpoints Z and Y, and a combination of the distributions, respectively, for the second implementation of the circuit as shown in FIG. 6.
Figure 7B:
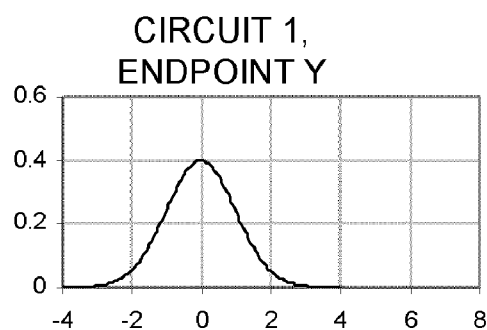
Figure 8B:
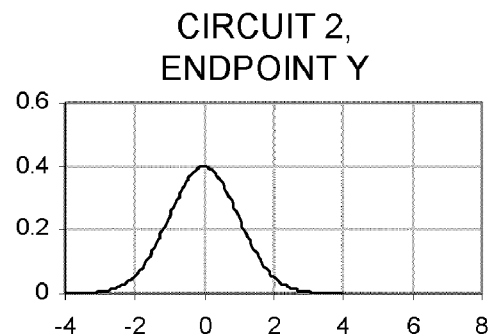
Figure 7C:
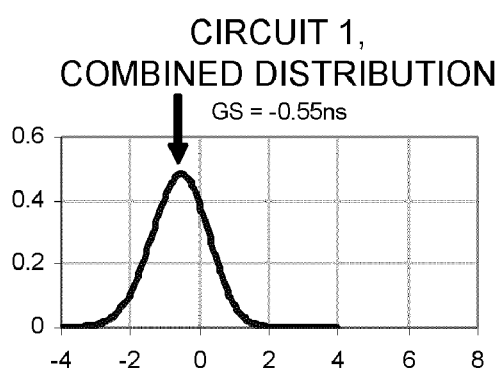
Figure 8C:
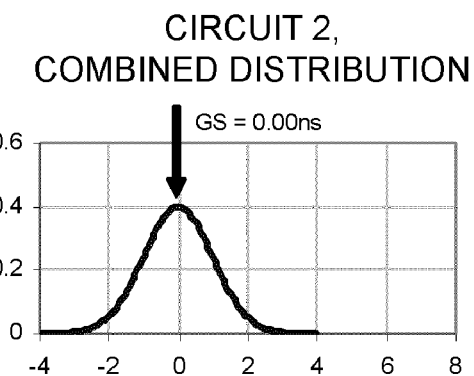

FIGS. 7A-7C illustrate computation of the global distribution for the implementation shown in FIG. 5, while FIGS. 8A-8C illustrate computation of the global distribution for the implementation shown in FIG. 6.

FIG. 5 illustrates a first circuit implementation, "Circuit 1." The first circuit implementation includes timing endpoints Z and Y. Timing endpoint Z is driven by a circuit path comprising seven AND-gates 501-507 in a cascaded configuration, and has a path length determined by the propagation delays through the components and interconnecting lines. Timing endpoint Y in Circuit 1 is driven by a circuit path (gates 511-517) which is similar to that driving timing endpoint Z, and has a similar path length.

FIG. 6 illustrates a second circuit implementation, "Circuit 2," which performs the same function as the first circuit implementation. In Circuit 2, the timing endpoint Z is driven by a more hierarchical configuration of gates, having three levels of circuit components, where the first layer includes AND-gates 601-604, the second level includes AND-gates 605-606, and the last level includes AND-gate 607. The timing endpoint Y in Circuit 2 is driven by a circuit path (gates 511-517) which is unchanged over the implementation Circuit 1. Thus, the path length for the timing endpoint Z can be shorter than the path length for the timing endpoint Y in the second implementation Circuit 2, depending of course on the particular components and interconnections chosen.

Conventional timing analysis would suggest that Circuit 1 and Circuit 2 have equal speed because their longest paths have equal length. However, when you allow for uncertainty, you see that Circuit 1 is likely to be slower than Circuit 2. The graphs shown in FIGS. 7A-7C and FIGS. 8A-8C illustrate this effect. Endpoint Z in Circuit 2 has faster logic, and is thus unlikely to affect circuit timing. Therefore, the likelihood of overall negative slack in circuit 1 is higher than in circuit 2. This can be understood because Circuit 1 has two endpoints with a 50/50 chance of negative slack, whereas Circuit 2 has only one endpoint with a 50/50 chance of negative slack.

FIG. 7A illustrates a Gaussian distribution around the estimated slack value of 0 ns for Endpoint Z of Circuit 1. FIG. 7B illustrates a Gaussian distribution around the estimated slack value of 0 ns for Endpoint Y of Circuit 1. Because the path lengths are essentially the same for each of the timing endpoints in Circuit 1, the standard deviation of the distributions is the same. The combined distribution for Circuit 1 is illustrated in FIG. 7C, and is skewed slightly toward negative slack having a mean at about −0.55 ns.

In contrast, FIG. 8A illustrates a Gaussian distribution around the estimated slack value of 4 ns for endpoint Z of Circuit 2. FIG. 7B illustrates a Gaussian distribution around the estimated slack value of 0 ns for endpoint Y of Circuit 2. Because the path length for endpoint Z is less than that for endpoint Y in Circuit 2, the standard deviation of the distributions could be adjusted as discussed above. In an embodiment in which the standard deviation for endpoint Z is determined as a function of path length, the plot in FIG. 8A would have a narrower bell curve than that of FIG. 8B. The combined distribution for Circuit 2 is illustrated in FIG. 8C, assuming the same standard deviation for each distribution, and is dominated by the distribution for endpoint Y for Circuit 2, and has a mean value of about 0.00 ns.

Thus, the Gaussian slack parameter measures expected circuit speed in the presence of uncertainty. The Gaussian slack of a circuit is the median of the combined distribution of all the timing endpoints in a circuit or circuit module, in one embodiment. The arrows in FIG. 7C and FIG. 8C show a Gaussian slack for Circuit 1 and Circuit 2. Circuit 1 is slower under the Gaussian slack measure because it has twice as many endpoints that are at risk for becoming slower in subsequent steps in the design flow. A critical endpoint is an endpoint equal to or close to the maximum negative slack for the circuit design. Such endpoints are critical endpoints for the purposes of establishing overall clock speed. A near-critical endpoint is an endpoint with positive or negative slack, whose probability distribution substantially overlaps with the critical timing constraint. The more critical and near-critical endpoints in the circuit, the more chances there are that one of them will significantly slow circuit timing.

In the example described with reference to FIGS. 5 and 6, it can be seen that the combined distribution degrades when modifications increase from one critical endpoint to two critical endpoints in a circuit. As the number of endpoints increases, the Gaussian slack degrades with each additional near-critical endpoint, the amount of additional degradation per endpoint decreases, and the spread of the combined distribution gets more narrow. This effect is illustrated in FIGS. 9A-9E.

Figure 9A:
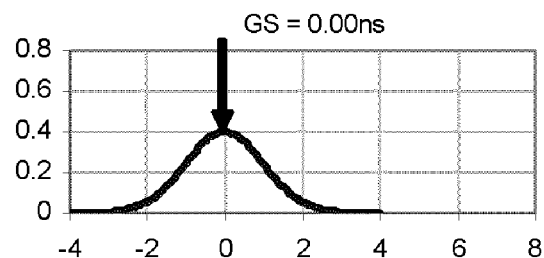
FIGS. 9A-9E illustrate results of combining Gaussian slack distributions for 1, 2, 4, 8 and 16 endpoints in a circuit, each having 0.00 ns of slack.
Figure 9B:
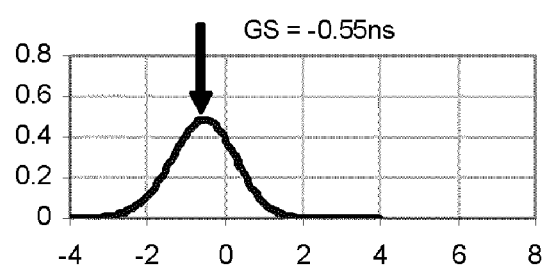
Figure 9C:
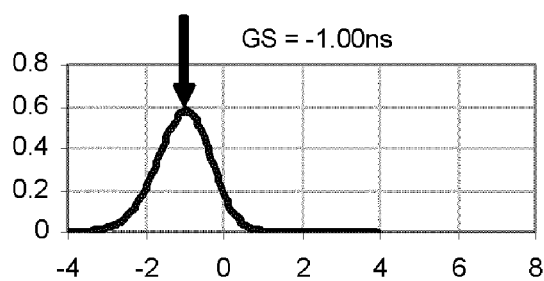
Figure 9D:
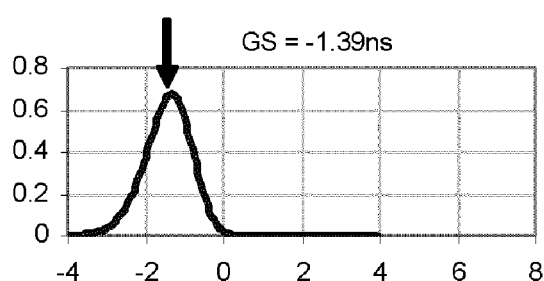
Figure 9E:
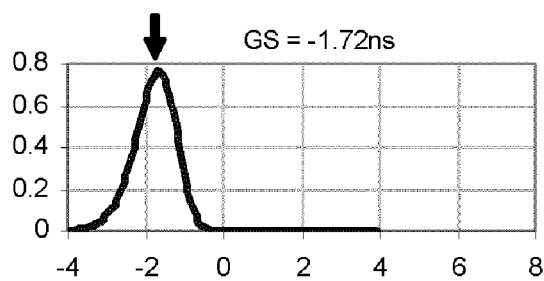

FIG. 9A shows a distribution for one endpoint at 0.0 ns, and a resulting Gaussian slack of 0.0 ns. FIG. 9B shows the combined distribution for 2 endpoints with equal standard deviation at 0.0 ns, and a resulting Gaussian slack of −0.55 ns. FIG. 9C shows the combined distribution for 4 endpoints with equal standard deviation at 0.0 ns, and a resulting Gaussian slack of −1.00 ns. FIG. 9D shows the combined distribution for 8 endpoints with equal standard deviation at 0.0 ns, and a resulting Gaussian slack of −1.39 ns. FIG. 9E shows the combined distribution for 16 endpoints with equal standard deviation at 0.0 ns, and a resulting Gaussian slack of −1.72 ns.

This effect can be understood with reference to the example of rolling a pair of dice. If you throw a pair of dice once, seven is the most likely roll. If you take the lowest of the three rolls, you are likely to get about four. If you take enough rolls, the lowest one will almost certainly be a two. Each near-critical timing point is like a roll of the dice. The more you have, the lower the worst one is likely to be.

Figure 10A:
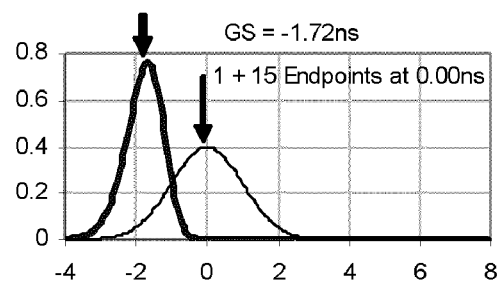
FIGS. 10A-10E illustrate results of combining Gaussian slack distributions for 1 endpoint with 0.00 ns of slack, with Gaussian slack distributions for 15 endpoints having 0.00, 0.50, 1.00, 2.00, and 4.00 ns of slack, respectively.
Figure 10B:
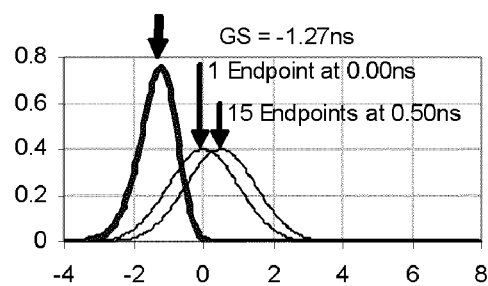
Figure 10C:
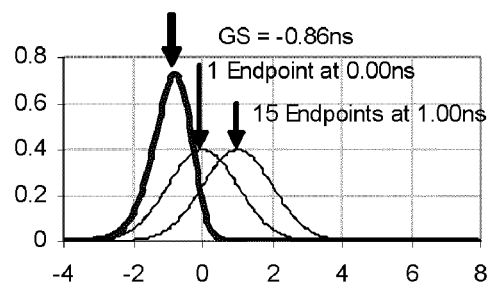
Figure 10D:
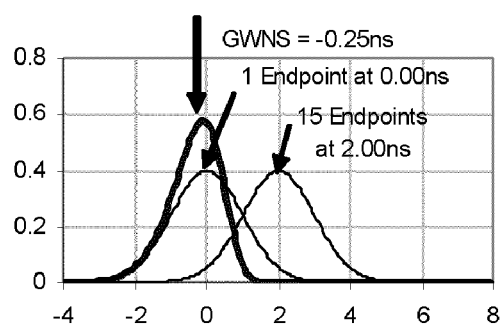
Figure 10E:
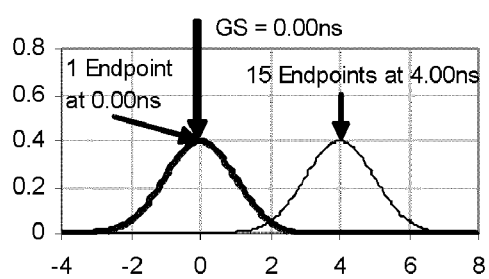

FIGS. 10A-10E illustrate the effect of non-critical endpoints on the Gaussian slack parameter. As the endpoints get more positive slack, the probability that they will impact timing shrinks, and the combined distribution begins to match that of the remaining near-critical endpoints. FIG. 10A shows the combined distribution of 16 timing endpoints at 0.00 ns, with a resulting Gaussian slack of −1.72 nanoseconds. FIG. 10B shows the combined distribution of one endpoint at 0.0 ns and 15 endpoints at 0.50 ns, and a resulting Gaussian slack of −1.27 ns. FIG. 10C shows the combined distribution of one endpoint at 0.0 ns and 15 endpoints at 1.00 ns, and a resulting Gaussian slack of −0.86 ns. FIG. 10D shows the combined distribution of one endpoint at 0.0 ns and 15 endpoints at 2.00 ns, and a resulting Gaussian slack of −0.25 ns. FIG. 10E shows the combined distribution of one endpoint at 0.0 ns and 15 endpoints at 4.00 ns, with a resulting Gaussian slack of 0.00 ns.

Figure 11:
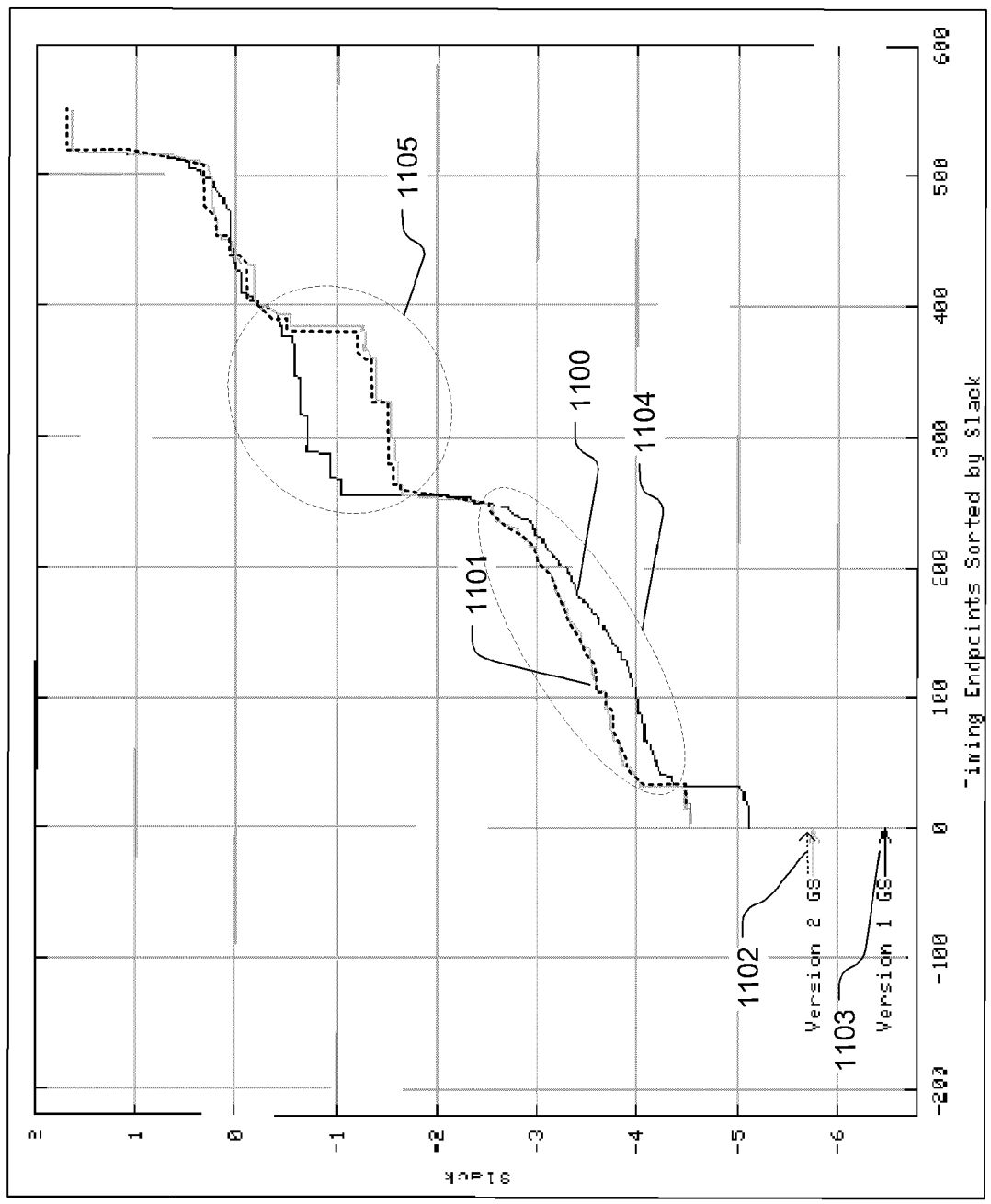
FIG. 11 is a graph showing endpoint timing for two versions of a circuit, along with Gaussian slack for each version.

Designers use Total Negative slack (TNS) to see past the most critical paths to better understand the overall status of all critical timing endpoints in a circuit. Gaussian slack also considers near-critical endpoints, but gives more weight to endpoints that are closer to the worst slack. The graph shown in FIG. 11 shows the endpoint timing for two versions of a circuit. The endpoints are sorted by slack and then numbered with the most critical endpoints starting at zero. Each endpoint is plotted with the endpoint number on the x-axis and the endpoint slack on the y-axis. The Gaussian slack is marked with the horizontal arrows labeled GS. Thus, trace 1100 is a plot for a first version of a circuit and trace 1101 is a plot for a second version of a circuit. The Gaussian slack for the first version is about −6.5 at point 1103*m* and is worse than the Gaussian slack for the second version of about −5.8 at point 1102. In this example, the Gaussian slack is better for version 2 than for version 1. However, the total negative slack for version 2 is worse than the total negative slack for version 1. This indicates that version 2 has better slack in the more critical endpoints, but worse slack in the less critical endpoints. The difference in the TNS between the two versions equals the area between the curves 1100 and 1101. The area between the curves where version 2 is better (including the area within circle 1104) is smaller than the area between the curves where version 1 is better (including the area within circle 1105). Therefore version 1 has better overall TNS. However, version 1 is an inferior design because the endpoints where it has better slack (e.g. in area 1105) are much less likely to become critical compared to the endpoints where version 2 is better (e.g. in area 1104). The Gaussian slack for version 1 is more negative than the Gaussian slack for version 2, providing an indication that version 1 is in fact better, while the TNS measure would provide the opposite information. A circuit optimization process relying on TNS would therefore diverge from an improved circuit implementation with the information shown in FIG. 11, while a circuit optimization process relying on Gaussian slack would converge on an improved implementation more readily.

If timing constraints were loosened, the region where version 1 did better would shift to positive slack, and would be excluded from the TNS calculation. In this case, the TNS measure would have correctly identified version 2 as the superior design. Because the Gaussian slack puts more emphasis on endpoints whose slack is closer to the critical endpoint, Gaussian slack is not as susceptible as TNS to measurement errors caused by overly tight or loose timing constraints.

Figure 12:
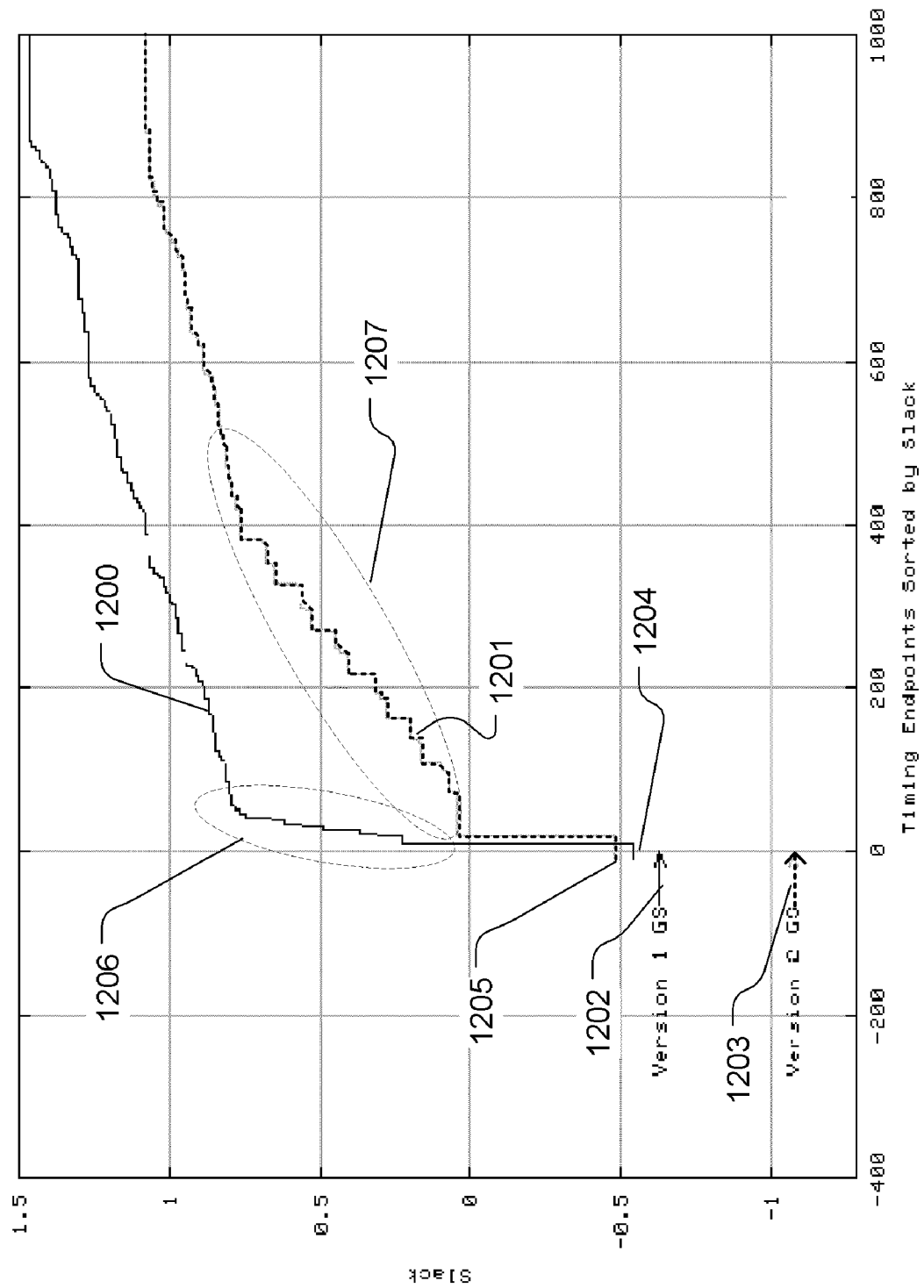
FIG. 12 is a graph showing endpoint timing for two versions of a circuit, along with worst negative slack and Gaussian slack parameters.

The worst negative slack parameter WNS indicates the slack of the worst endpoint in the set of endpoints being evaluated. If an alternative implementation is created that improves the WNS, but degrades the near-critical endpoints, you could see an improved WNS but a degraded Gaussian slack for the new circuit. FIG. 12 is a plot of an example in which an improved WNS resulted in a degraded Gaussian slack.

The graph shown in FIG. 12 shows the endpoint timing for two versions of a circuit. The endpoints are sorted by slack and then numbered with the most critical endpoints starting at zero. Each endpoint is plotted with the endpoint number on the x-axis and the endpoint slack on the y-axis. The Gaussian slack is marked with the horizontal arrows labeled GS. Thus, trace 1200 is a plot for a first version of a circuit and trace 1201 is a plot for a second version of a circuit. The Gaussian slack for the first version is about −0.6 at point 1203, and is better than the Gaussian slack for the second version of about −1.1 at point 1204. The WNS for version 1 is about −0.55 at point 1204. The WNS for version 2 is improved at about −0.45 at point 1205. Thus, the revision from version 1 to version 2 improved the WNS slightly but degraded the Gaussian slack. The degradation in Gaussian slack can be understood because version 1 has more margin in the endpoints within region 1206 (fewer near-critical endpoints), while version 2 has less margin in endpoints within region 1207 (more near-critical endpoints). The decision about whether version 1 is better than version 2 depends on whether the final timing exactly matches the estimated timing at the time of the calculation of the Gaussian slack and the WNS. If the final timing exactly matches, then version 2 with a better WNS will have a faster clock rate. However, if the final timing varies from the measured values, version 1 is likely to result in a faster design because the rest of the endpoints are farther from critical and more immune to design changes and more immune to variations from the timing model. Embodiments of the technology generate both WNS and Gaussian slack parameters.

Embodiments of the technology take into account the fact that all endpoints with slack in near critical slack can affect timing during the design iterations, whether those endpoints have positive or negative slack. A near-critical endpoint with positive slack could become negative later in the design flow by circuit changes. When timing can vary, the fact that the Gaussian slack parameter reflects even positive slack endpoints results in better information for some design iterations.

An embodiment of the technology uses Gaussian distributions with a mean that is equal to the values of slack measured by the timing verifier, and with a standard deviation equal to about 1/10 of the path length. The ratio of about 1/10 was selected from experience with a large collection of design flows from RTL functional level to geometric mask layout level at GDSII. This ratio can vary depending on the library of components utilized in implementation, the timing model applied, and experience with particular applications of the technology. Although implementations described herein used the values of slack measured by the timing verifier as the mean for the distributions, other functions of the value of slack measured by the timing verifier could be applied.

Embodiments of the technology combine the distributions assigned to each endpoint based on an assumption that each endpoint is independent of the others. The worst endpoint determines overall circuit performance, so each additional endpoint increases the odds of a more negative slack. In fact, changes to endpoint timing are not completely independent. For example, a routing change made to improve a timing endpoint on a particular circuit path could slow several other timing endpoints. By applying an independent Gaussian distribution to the timing endpoints, the computation is more straightforward, and will typically result in computed Gaussian slack values being somewhat more negative than necessary. The results however are still very useful, especially when comparing two implementations of the same circuit.

In a sample of a computer program used to compute a Gaussian slack value from an array of slack values generated by a timing verifier is set forth in Table 2. The program includes a first module in lines 23-41 that returns the cumulative distribution function CDF for a standard Gaussian distribution (also known as a standard normal distribution). A standard Gaussian distribution has a mean of zero and a standard deviation of 1, where the cumulative distribution function is essentially the integral of the Gaussian probability distribution function. The program includes a second module in lines 44-81 which combines the cumulative distribution functions for the timing endpoints by multiplication, and offsets the result by −0.5. The program includes a third module in lines 84-135 which accepts as input an array of the slack values outputted by the timing verifier, and an array of standard deviation values computed as a function of the path lengths. The first module is called to compute CDF functions for each of the endpoints and the second module is called to combine the CDF functions to produce the combined distribution, offset by −0.5 to create as zero crossing or root in the curve at the median of the combined distribution. The module then defines a set of bounds in the curve for use by a program that finds the zero crossing. The zero crossing is then output as the Gaussian slack.

TABLE 2

Copyright Synopsys Inc. 2005

```
/*
    Estimator for the median of the max of
    several normally distributed random variables
*/
#include <math.h>
#include <stdio.h>
#include <stdlib.h>
#include "wnasrt.h"
#include "wnlib.h"
#include "wnroot.h"
#define DEBUG         FALSE
local double *m, *s;
local int num_vars;
local double standard_normal_distribution
(
  double x
)
{
    if(x > 0.0)
    {
        return (0.5 + 0.5 * erf(M_SQRT1_2 * x));
    }
    else if(x < 0.0)
    {
        return(0.5 − 0.5 * erf(−M_SQRT1_2 * x));
    }
    else
    {
        wn_assert(x == 0.0);
        return(0.5);
    }
}
local double max_distribution
(
  double x
)
{
    double ret;
    int i;
    ret = 1.0;
    for(i = 0; i < num_vars; ++i)
    {
        if(s[i] == 0.0)
        {
            if(x > m[i])
            {
            }
            else if(x < m[i])
            {
                ret = 0.0;
            }
            else
            {
                wn_assert(x == m[i]);
            }
        }
        else if(s[i] > 0.0)
        {
            ret *= standard_normal_distribution((x − m[i]) / s[i]);
        }
        else
        {
            wn_assert_notreached( );
        }
    }
    /* printf("x = %g, f = %lg\n", x, ret − 0.5); */
    return(ret − 0.5);
}
EXTERN double median_of_max_of_normal_distributions
(
  double *mean,
  double *stdev,
  double *weights, /* Returned value */
  int num_paths
)
{
    double ret, f0, x1, f1, x2, f2;
    int code, i;
```

TABLE 2-continued

Copyright Synopsys Inc. 2005

```
    num_vars = num_paths;
    m = mean;
    s = stdev;
    x1 = −WN_FHUGE;
    x2 = −WN_FHUGE;
    for(i = 0; i < num_paths; ++i)
    {
        if(x1 < mean[i])
        {
            x1 = mean[i];
        }
        wn_assert(stdev[i] >= 0.0);
        if(x2 < mean[i] + stdev[i])
        {
            x2 = mean[i] + stdev[i];
        }
    }
    if(x2 == x1)
    {
        x2 *= 1.01;
    }
    f1 = max_distribution(x1);
    f2 = max_distribution(x2);
#if DEBUG
    printf("x1 = %20.20lg, f1 = %20.20lg\n", x1, f1);
    printf("x2 = %20.20lg, f2 = %20.20lg\n", x2, f2);
#endif
    wn_findroot (&code, &ret, &f0, x1, f1, x2, f2,
                &max_distribution, WN_IHUGE);
    compute_weights(weights, mean, stdev, num_paths, ret);
#if DEBUG
    printf("wn_findroot: code = %d, x0 = %lg, f0 = %lg\n", code,
    ret, f0);
#endif
    return(ret);
}
```

Figure 13:
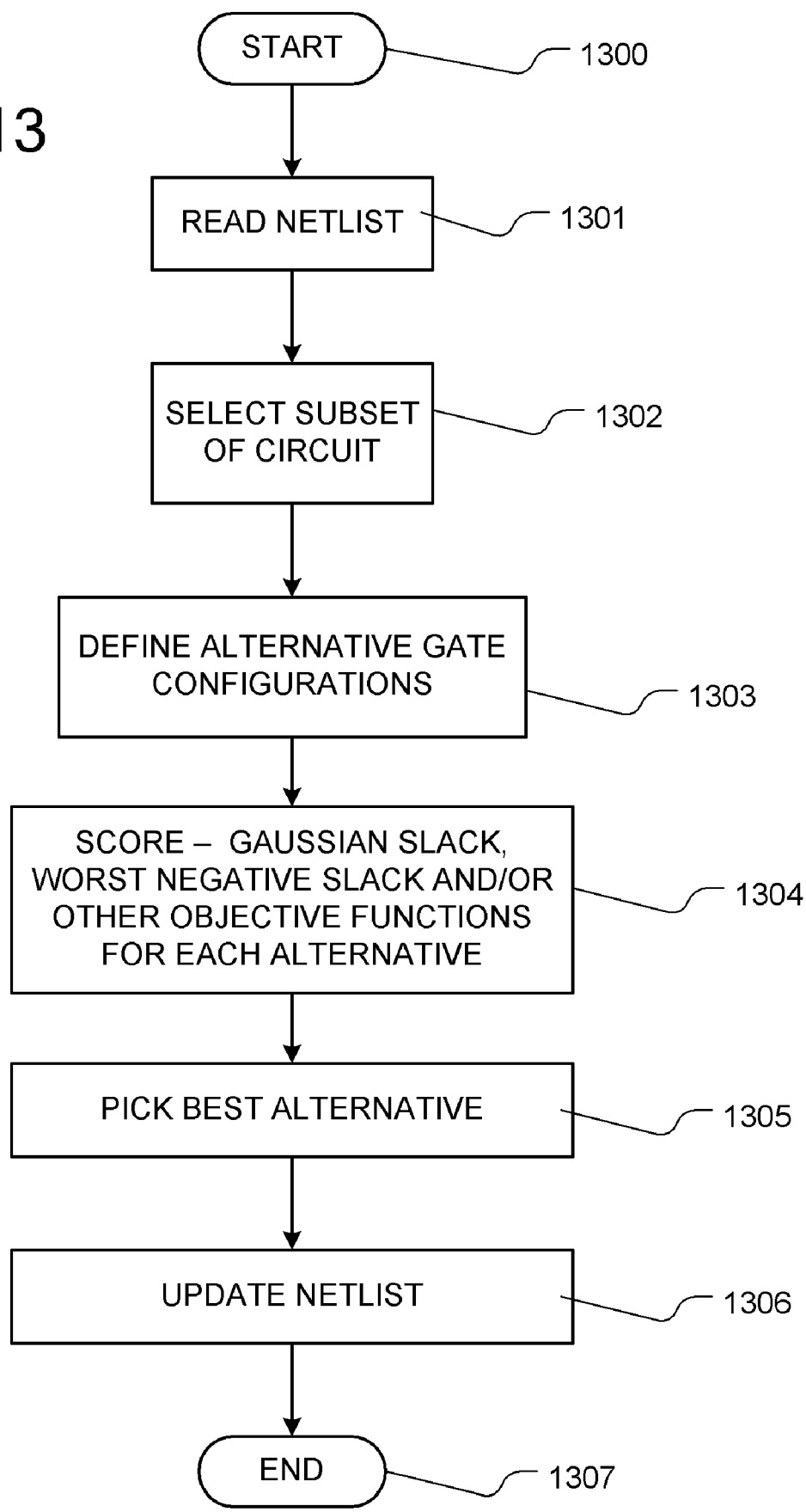
FIG. 13 is a simplified flow chart for a computer-implemented design optimization process applying Gaussian slack.

FIG. 13 is a simplified flow chart of the procedures executed by an electronic design automation system including a Gaussian slack computation module, as executed at a logic synthesis stage of a design flow. The procedure starts at block 1300. The netlist of a circuit or circuit module under design is read at block 1301. A subset of the circuit is selected with a corresponding set of timing endpoints (block 1302). The subset selected can be just a few gates, a circuit module for the design, or the entire netlist including all circuit modules. Alternative circuit configurations at the logic level are defined (block 1303). The alternative circuit configurations can include changes such as different gates, different locations for the gates, different configurations of the gates such as illustrated in FIGS. 5 and 6, different paths for routing between the gates and so on. Each of the alternative configurations is scored, by computing and outputting Gaussian slack (block 1304). Optionally, worst negative slack and or other objective functions are also computed at the scoring step. Based on the score, one of the alternative gate configurations is selected by an optimization engine being executed by the data processor, at block 1305. This process can be repeated to choose among several or many alternative configurations in an iterative fashion, throughout the design procedure, using automatic optimization engine, or can be used to generate data related to a number of different configurations for other reasons. The machine-readable file that includes the netlist is updated based on the selected alternative at block 1306, and the procedure ends at block 1307.

Alternatively, or in combination with the use by the optimization engine, the results of the Gaussian slack computation are converted to a form for presentation to the user, such as a value indicating change in Gaussian slack, a chart showing Gaussian slack for a plurality of alternative circuit configurations, or a percent change in clock speed displayed on a graphical user interface.

The procedures illustrated with reference to FIG. 13 can be executed in a large number of points in the design flow in which Gaussian slack can be computed to indicate design progress and to select alternative implementations of the circuit being designed.

Although the parameter calculated in implementations described above is referred to as Gaussian slack, it will be understood that other types of probability distribution functions could be utilized. For example, a Gaussian distribution has a symmetrical, normal curve. However, other probability distributions which are not symmetrical, or which deviate in other ways from the standard normal curve, could be utilized. Rather than, or in addition to, outputting a parameter that reflects the result of the combination of distributions, such as the mean or median of the combined distribution used for Gaussian slack, an implementation of the technology includes logic for the electronic design automation system to display on a graphical user interface, a plot of the combined distribution or overlaying plots of a plurality of combined distributions for alternative implementations.

An automated design process is described that is executed using a computer system, which includes identifying a set of timing endpoints in a circuit defined by a machine-readable file. Values of slack in the estimated arrival times for the timing endpoints are assigned. Probability distribution functions, such as Gaussian distributions, are assigned for the respective values of slack, and combined. The combination of probability distribution functions represents a measure of circuit performance. The measure is computed for alternative implementations of the circuit, and used to identify an alternative more likely to meet timing constraints.

In general, a new measure of circuit speed is provided by the technology described herein. The measure is derived from all timing endpoints in a set of timing endpoints selected for evaluation, including endpoints with positive and negative slack. The procedure gives greater weight to inputs that are closer to the most negative slack values in the set of inputs. The new measure is readily computed with some simplifying assumptions, and provides useful information which can be applied in electronic design automation systems for complex integrated circuits.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A computer-implemented method for automated design of a circuit specified by a machine-readable file having a specified timing constraint, comprising:
    identifying, using a computer system, a set of timing endpoints for corresponding circuit paths in the circuit defined by the machine-readable file, wherein said corresponding circuit paths include respective sets of components;
    assigning, using the computer system, respective values for slack for the timing endpoints in said set of timing endpoints, said values represented by respective probability distribution functions; and
    processing said respective values for slack to produce a combined probability distribution representing said set of timing endpoints, by combining the probability distribution functions representing the respective values of slack, the combined probability distribution being weighted in favor of probability distribution functions for values for slack of timing endpoints having negative slack.

2. The method of claim 1, wherein said probability distribution functions comprise Gaussian or approximately Gaussian distributions.

3. The method of claim 1, including
    storing, in a machine-readable storage medium, definitions of components usable in implementation of the circuit; and
    using a timing model and said definitions for said components to generate said values for slack.

4. A computer-implemented method for automated design of a circuit specified by a machine-readable file having a specified timing constraint, comprising:
    identifying, using a computer system, a set of timing endpoints for corresponding circuit paths in the circuit defined by the machine-readable file, wherein said corresponding circuit paths include respective sets of components;
    assigning, using the computer system, respective values for slack for the timing endpoints in said set of timing endpoints, said values represented by respective probability distribution functions; and
    processing said respective values for slack to produce a combined probability distribution representing said set of timing endpoints, by combining the probability distribution functions representing the respective values of slack, the combined probability distribution being weighted in favor of probability distribution functions for values for slack of timing endpoints having negative slack, wherein said processing includes:
    combining the respective probability distribution functions by multiplication of corresponding cumulative distribution functions.

5. The method of claim 1, including
    selecting an alternative set of components for one or more of said corresponding circuit paths to define an alternative circuit implementation;
    assigning, using the computer system, respective values for slack for the timing endpoints in said set of timing endpoints for the alternative circuit implementation; and
    processing said respective values for slack to produce a second combined probability distribution.

6. The method of claim 5, including updating said machine-readable file in response to comparison of the first-mentioned combined probability distribution and said second combined probability distribution.

7. The method of claim 1, including displaying a graphical user interface, and presenting said first combination as output from the computer in the graphical user interface.

8. The method of claim 1, wherein said combined probability distribution is produced based on an assumption that the timing endpoints in the set are independent.

9. The method of claim 1, including computing a slack parameter to represent said combined probability distribution.

10. A computer-implemented method for automated design of a circuit specified by a machine-readable file having a specified timing constraint, comprising:
    identifying, using a computer system, a set of timing endpoints for corresponding circuit paths in the circuit defined by the machine-readable file, wherein said corresponding circuit paths include respective sets of components;

storing, in a machine-readable storage medium, definitions of components usable in implementation of the circuit;

using a timing model and said definitions for said components to generate using the computer system values for slack for timing endpoints in the set of timing endpoints;

assigning probability distribution functions of respective values for slack for the said timing endpoints in the set of timing endpoints, wherein said probability distribution functions comprise Gaussian or approximately Gaussian distributions; and combining said probability distribution functions using the computer system to produce a combined probability distribution representing the set, and storing the combined probability distribution in a machine-readable storage medium.

11. The method of claim 10, wherein said timing endpoints in said set comprise nodes on circuit paths having respective path lengths equal to an amount of time for a signal to propagate through the circuit path, and said Gaussian or approximately Gaussian distributions have respective means equal to a function of the values for slack of the corresponding timing endpoints, and have respective standard deviations equal to a function of the respective path lengths.

12. The method of claim 10, including selecting an alternative set of components for one or more of said corresponding circuit paths to define an alternative circuit implementation;

assigning, using the computer system, respective values for slack for the timing endpoints in said set of timing endpoints for the alternative circuit implementation; and processing said respective values for slack to produce a second combined probability distribution.

13. The method of claim 12, including updating said machine-readable file in response to comparison of the first-mentioned combined probability distribution and said second combined probability distribution.

14. The method of claim 10, wherein said combined probability distribution is produced based on an assumption that the timing endpoints in the set are independent.

15. The method of claim 10, including computing a slack parameter to represent said combined probability distribution.

16. An article of manufacture, comprising a machine-readable data storage medium storing a computer program for analysis of a circuit specified by a machine-readable file having a specified timing constraint, the resources including logic executable to perform functions including identifying a set of timing endpoints for corresponding circuit paths in the circuit defined by the machine-readable file, wherein said corresponding circuit paths include respective sets of components;

assigning respective values for slack for the timing endpoints in said set of timing endpoints, said values represented by respective probability distribution functions; and producing in response to said respective values for slack a combined probability distribution for the respective values for slack, wherein the a combined probability distribution represents said set of timing endpoints weighted in favor of probability distribution functions for values for slack of timing endpoints having negative slack.

17. An article of manufacture, comprising a machine-readable data storage medium storing a computer program for analysis of a circuit specified by a machine-readable file having a specified timing constraint, the resources including logic executable to perform functions including identifying, using a computer system, a set of timing endpoints for corresponding circuit paths in the circuit defined by the machine-readable file, wherein said corresponding circuit paths include respective sets of components;

storing, in a machine-readable storage medium, definitions of components usable in implementation of the circuit;

using a timing model and said definitions for said components to generate values for slack for timing endpoints in the set of timing endpoints;

assigning probability distribution functions of respective values for slack for the said timing endpoints in the set of timing endpoints, wherein said probability distribution functions comprise Gaussian or approximately Gaussian distributions; and combining the probability distribution functions to produce a combined probability distribution representing the set.

18. An electronic design automation system, comprising:

a data processor, including data processing resources for analysis of a circuit specified by a machine-readable file having a specified timing constraint, the resources including logic executable to perform functions including identifying a set of timing endpoints for corresponding circuit paths in the circuit defined by the machine-readable file, wherein said corresponding circuit paths include respective sets of components;

assigning respective values for slack for the timing endpoints in said set, said values represented by respective probability distribution functions; and producing in response to said respective values for slack a combined probability distribution representing said set of timing endpoints, the a combined probability distribution weighted in favor of probability distribution functions for values for slack of timing endpoints having negative slack.

19. The system of claim 18, wherein said probability distribution functions comprise Gaussian or approximately Gaussian distributions.

20. The system of claim 18, wherein the resources include logic executable to perform functions including:

reading from a machine-readable storage medium, definitions of components usable in implementation of the circuit; and using a timing model and said definitions for said components to generate said values for slack.

21. An electronic design automation system, comprising:

a data processor, including data processing resources for analysis of a circuit specified by a machine-readable file having a specified timing constraint, the resources including logic executable to perform functions including identifying a set of timing endpoints for corresponding circuit paths in the circuit defined by the machine-readable file, wherein said corresponding circuit paths include respective sets of components;

assigning respective values for slack for the timing endpoints in said set, said values represented by respective probability distribution functions; and producing respective values for slack a combined probability distribution representing said set of timing endpoints, the combined probability distribution weighted in favor of probability distribution functions for values for slack of timing endpoints having negative slack, wherein said producing includes:

assigning said probability distribution functions of respective values for slack for the plurality of timing endpoints; and combining the respective probability distribution functions by multiplication of the respective probability distribution functions.

22. The system of claim 18, wherein the resources include logic executable to perform functions including:

selecting an alternative set of components for one or more of said corresponding circuit paths to define an alternative circuit implementation;

assigning, using the computer system, respective values for slack for the timing endpoints in said set of timing endpoints for the alternative circuit implementation; and processing said respective estimated values for slack to produce a second combined probability distribution for values for slack for the respective timing endpoints, wherein the second combined probability distribution represents said set of timing endpoints weighted in favor of probability distribution functions for values for slack of timing endpoints having negative slack.

23. The system of claim 22, wherein the resources include logic executable to update said machine-readable file in response to comparison of the first-mentioned combined probability distribution and said second combined probability distribution.

24. The system of claim 18, including a graphical user interface, and logic for presenting said first combined probability distribution as output from the computer in the graphical user interface.

25. The system of claim 18, wherein said combined probability distribution is produced based on an assumption that the timing endpoints in the set are independent.

26. The system of claim 18, wherein the resources include logic executable to compute a slack parameter to represent said combined probability distribution.

27. A computer-implemented method for automated design of a circuit specified by a machine-readable file having a specified timing constraint, comprising:

identifying, using a computer system, a set of timing endpoints for corresponding circuit paths in the circuit defined by the machine-readable file, wherein said corresponding circuit paths include respective sets of components;

storing, in a machine-readable storage medium, definitions of components usable in implementation of the circuit;

using a timing model and said definitions for said components to generate using the computer system values for slack for timing endpoints in the set of timing endpoints;

assigning probability distribution functions of respective values for slack for the said timing endpoints in the set of timing endpoints, wherein said probability distribution functions comprise Gaussian or approximately Gaussian distributions; and combining said probability distribution functions by multiplication, using the computer system to produce a combined probability distribution representing the set, and storing the combined probability distribution in a machine-readable storage medium.

* * * * *

UNITED STATES PATENT AND TRADEMARK OFFICE
CERTIFICATE OF CORRECTION

PATENT NO.         : 8,146,047 B2                                       Page 1 of 1
APPLICATION NO.    : 12/341677
DATED              : March 27, 2012
INVENTOR(S)        : Gregory et al.

It is certified that error appears in the above-identified patent and that said Letters Patent is hereby corrected as shown below:

On the Title Page, Item (54) and in the Specification, column 1, line 1, the Title, before the word "Automation", insert -- Design --.

In the Claims

In claim 21, column 16, line 64, after the word "producing", insert -- in response to said --.

Signed and Sealed this
Twenty-fourth Day of June, 2014

Michelle K. Lee
*Deputy Director of the United States Patent and Trademark Office*